(12) United States Patent
Kim et al.

(10) Patent No.: US 7,285,456 B2
(45) Date of Patent: Oct. 23, 2007

(54) METHOD OF FABRICATING A FIN FIELD EFFECT TRANSISTOR HAVING A PLURALITY OF PROTRUDING CHANNELS

(75) Inventors: Sung-Min Kim, Incheon-si (KR); Eun-Jung Yun, Seoul (KR)

(73) Assignee: Samsung Electronics Co., Ltd. (KR)

( * ) Notice: Subject to any disclaimer, the term of this patent is extended or adjusted under 35 U.S.C. 154(b) by 183 days.

(21) Appl. No.: 11/295,770

(22) Filed: Dec. 7, 2005

(65) Prior Publication Data

US 2006/0160302 A1 Jul. 20, 2006

(30) Foreign Application Priority Data

Dec. 10, 2004 (KR) .................. 10-2004-0104001

(51) Int. Cl.
*H01L 21/8238* (2006.01)
(52) U.S. Cl. .............. 438/209; 438/135; 438/156; 438/175; 438/E21.415
(58) Field of Classification Search ........ 438/156–157, 438/135–138, 173, 209–212, 286
See application file for complete search history.

(56) References Cited

U.S. PATENT DOCUMENTS

| | | | |
|---|---|---|---|
| 6,391,782 B1 | 5/2002 | Yu | 438/696 |
| 6,562,665 B1 | 5/2003 | Yu | 438/149 |
| 6,642,090 B1 | 11/2003 | Fried et al. | 438/164 |
| 6,664,582 B2 | 12/2003 | Fried et al. | 257/308 |
| 2004/0219722 A1* | 11/2004 | Pham et al. | 438/157 |
| 2005/0051825 A1* | 3/2005 | Fujiwara et al. | 257/308 |

FOREIGN PATENT DOCUMENTS

KR 10-2002-0096654 12/2002

\* cited by examiner

*Primary Examiner*—Dung A. Le
(74) *Attorney, Agent, or Firm*—Mills & Onello LLP

(57) ABSTRACT

In a method of fabricating a fin field effect transistor having a plurality of protruding channels, the fin field effect transistor is formed by forming a dummy gate pattern on a first hard mask pattern and a first insulating layer on a semiconductor substrate having an active region pattern, forming a source and drain region in a portion of the active region pattern, forming a plurality of vertically protruding channels between the source and drain region, forming a gate dielectric layer on the active region pattern having the plurality of protruding channels, and forming a gate electrode on the gate dielectric layer.

28 Claims, 20 Drawing Sheets

METHOD OF FABRICATING A FIN FIELD EFFECT TRANSISTOR HAVING A PLURALITY OF PROTRUDING CHANNELS

RELATED APPLICATIONS

The present application claims priority to Korean Patent Application Serial No. 10-2004-0104001, filed Dec. 10, 2004 in the Korean Intellectual Property Office, the contents of which are incorporated herein by reference, in their entirety.

BACKGROUND OF THE INVENTION

1. Field of the Invention

The present invention relates to a method of fabricating a fin field effect transistor (FinFET). More particularly, the present invention relates to a method of fabricating a fin field effect transistor (FinFET) having a plurality of vertically protruding channels in a semiconductor substrate.

2. Description of the Related Art

In order to improve the performance and reduce the fabrication cost of semiconductor devices, the integration density of semiconductor devices continues to increase. Increasing the integration density of semiconductor devices requires the development of techniques for reducing the feature size of semiconductor devices.

In conventional semiconductor fabricating processes, the channel length of a metal-oxide-semiconductor field effect transistor (MOSFET) is decreased to improve the operating speed and integration density of a semiconductor device. Such decrease in the channel length, however, may degrade the operational characteristics and effectiveness of the device as an active switch. For example, as the distance between the source and the drain is further reduced, a phenomenon referred to as the short channel effect can occur. Thus, it becomes difficult to effectively suppress the influence of the electrical potential of the drain on the electrical potentials of the source and channel. However, since a conventional MOSFET, in which a channel is disposed parallel to the upper surface of the semiconductor substrate, is a planar channel device, it is difficult to not only structurally scale down the device area consumed by the MOSFET, but also to suppress the occurrence of the short channel effect.

A FinFET has a structure in which a fin-shaped, three-dimensional active region is formed, and both lateral side surfaces and a top surface of the fin-shaped active region are surrounded by a gate. Thus, the FinFET includes a vertically oriented channel, rather than a planar channel. Unlike a planar MOSFET, since the FinFET includes a vertical channel that is disposed on a substrate, the size of the FinFET can be more readily scaled down, and the short channel effect can be mitigated by greatly reducing the junction capacitance of the drain. In addition, the FinFET offers other superior electrical properties such as higher drive current and lower leakage current induced by an improved sub-threshold current and reduced drain induced barrier lowering (DIBL). Accordingly, in view of these advantages of the FinFET, extensive research into replacing conventional MOSFETs with FinFETs has recently been conducted.

FinFET structures are described in U.S. Pat. No. 6,391,782 by Yu et al. entitled "Process for forming multiple active lines and gate-all-around MOSFET", U.S. Pat. No. 6,562,665 by Yu et al. entitled "Fabrication of field effect transistor with a recess in a semiconductor pillar in SOI technology", U.S. Pat. No. 6,642,090 by Fried et al. entitled "Fin FET device from bulk semiconductor and method for forming, and U.S. Pat. No. 6,664,582 by Fried et al. entitled "Fin memory cell and method of fabrication", each being incorporated herein by reference.

Although the FinFET offers these superior electrical characteristics, it is currently difficult to fabricate a FinFET having a very short and uniform channel width, e.g., less than 30 nm, because of the limitations of current lithography techniques. Such lithography-related limitations also lead to other disadvantages. For example, if the fin structures are not formed to a uniform width, current dispersion characteristics may be adversely affected. Also, to form a three-dimensional FinFET channel on a substrate, a photolithography process must be performed. However, the critical line width that can be obtained by the photolithography process is limited. Therefore, an improved method for forming a three-dimensional channel having a fine line width below the resolution limit of the photolithography process is required.

SUMMARY OF THE INVENTION

The present invention is therefore directed to a method of fabricating a fin field effect transistor (FinFET) having a plurality of protruding channels, in a manner that addresses one or more of the associated limitations and disadvantages of the related art.

It is a feature of an embodiment of the present invention to provide a method of fabricating a transistor having one or more three-dimensional channels in a single active region by forming fins having a uniform fine line width in a semiconductor substrate.

In one aspect, the present invention a method of fabricating a fin field effect transistor, comprising: forming a first hard mask pattern on a semiconductor substrate; forming an active region pattern by partially etching the semiconductor substrate using the first hard mask pattern as an etching mask layer; forming a second hard mask pattern by removing an outer edge portion of the first hard mask pattern to expose a top surface portion of the active region pattern; forming a first insulating layer on the second hard mask pattern and the active region pattern; planarizing the first insulating layer to expose a top surface portion of the second hard mask pattern; forming a dummy gate layer on the second hard mask pattern and the first insulating layer; forming a dummy gate pattern by partially removing the dummy gate layer, the first insulating layer, and the second hard mask pattern to partially expose a top surface portion of the active region pattern; forming a second insulating layer on the dummy gate pattern and the active region pattern; planarizing the second insulating layer to expose a top surface portion of the dummy gate pattern; removing the dummy gate pattern and the second hard mask pattern to partially expose a top surface portion of the active region pattern; forming a trench region in the active region pattern by partially etching the exposed portion of the active region pattern; partially etching the first insulating layer to form a plurality of vertically protruding channel structures in the active region pattern, at least one vertically protruding channel structure being on a front and a rear side of the trench region; forming a gate dielectric layer on the active region pattern having the plurality of protruding channels; and forming a gate electrode on the gate dielectric layer.

In one embodiment, the method further comprises forming a buffer oxide layer on the semiconductor substrate before forming the first hard mask pattern.

In another embodiment, planarizing the first insulating layer and the second insulating layer are performed by alternating processes of a CMP (Chemical Mechanical Polishing) process and an etching back process.

In another embodiment, the first and the second insulating layers comprise silicon dioxide.

In another embodiment, the silicon dioxide layer is formed in an HDP (High Density Plasma) process.

In another embodiment, the first hard mask pattern comprises silicon nitride.

In another embodiment, removing the dummy gate pattern and the first hard mask pattern is performed in a wet etching process.

In another embodiment, the wet etching process comprises a phosphoric acid process.

In another embodiment, the gate dielectric layer is formed in an atomic layer deposition process.

In another embodiment, forming the gate electrode comprises: depositing a gate electrode layer on the gate dielectric layer and the second insulating layer; and planarizing the gate electrode layer to expose a top surface portion of the second dielectric layer.

In another embodiment, removing the outer edge portion of the second hard mask pattern is performed in a wet etching process.

In another embodiment, the method further comprises forming a source and a drain region in exposed portions of the active region pattern before forming the second insulating layer.

In another embodiment, the semiconductor substrate is selected from the group consisting of a bulk silicon wafer, a silicon-on-insulator (SOI) substrate, a silicon germanium-on-insulator (SGOI) substrate, and a SiGe wafer.

In another embodiment, the plurality of vertically protruding channel structures are two in number and are parallel to each other.

In another embodiment, the plurality of vertically protruding channel structures have a thickness of about 30 nm or less.

In another embodiment, the plurality of vertically protruding channel structures comprise channel structures for transistors that are formed in at least one of a cell region and a peripheral region of a semiconductor device.

In another aspect, the present invention is directed to a method of fabricating a fin field effect transistor, comprising: forming a dummy gate layer on a first hard mask pattern and a first insulating layer on a semiconductor substrate having an active region pattern such that the first hard mask pattern partially covers a top portion of the active region pattern and such that a remaining portion of the top portion of the active region pattern is exposed; forming a dummy gate pattern by partially etching the dummy gate layer, the first insulating layer, and the first hard mask pattern to partially expose a top surface portion of the active region pattern; forming a source and drain region in the exposed active region; forming a second insulating layer on the dummy gate pattern and the active region pattern; planarizing the second insulating layer to expose a top surface portion of the dummy gate pattern; removing the dummy gate pattern and the first hard mask pattern to partially expose a top surface portion of the active region pattern; forming a trench region in the active region pattern by partially etching the exposed portion of the active region pattern; partially etching the first insulating layer to form a plurality of protruding channel structures in the active region pattern at opposed sides of the trench region; forming a gate dielectric layer on the active region pattern having the plurality of protruding channels; and forming a gate electrode on the gate dielectric layer.

In one embodiment, forming the gate electrode comprises: depositing a gate electrode layer on the gate dielectric layer and the second insulating layer; and planarizing the gate electrode layer to expose a top surface portion of the second dielectric layer.

In another embodiment, the first and second insulating layers comprise silicon dioxide.

In another embodiment, the silicon dioxide layer is formed in an HDP (High Density Plasma) process.

In another embodiment, the first hard mask pattern comprises silicon nitride.

In another embodiment, removing the dummy gate pattern and the first hard mask pattern is performed in a wet etching process.

In another embodiment, the wet etching process comprises a phosphoric acid strip process.

In another embodiment, the gate dielectric layer is formed in an atomic layer deposition process.

In another embodiment, the semiconductor substrate is selected from the group consisting of a bulk silicon wafer, a silicon-on-insulator (SOI) substrate, a silicon germanium-on-insulator (SGOI) substrate, and a SiGe wafer.

In another embodiment, the plurality of vertically protruding channel structures are two in number and are parallel to each other.

In another embodiment, the plurality of vertically protruding channel structures have a thickness of about 30 nm or less, In another embodiment, the plurality of vertically protruding channel structures comprise channel structures for transistors that are formed in at least one of a cell region and a peripheral region of a semiconductor device.

BRIEF DESCRIPTION OF THE DRAWINGS

The above features and advantages of the present invention will become more apparent to those of ordinary skill in the art by describing in detail exemplary embodiments thereof with reference to the attached drawings in which:

FIGS. 1b through 10b are cross-sectional views, taken along the I-I' section of FIGS. 1a through 10a respectively, in accordance with the present invention; and FIGS. 1c through 10c are cross-sectional views, taken along the II-II' section of FIGS. 1a through 10a respectively, in accordance with the present invention.

DETAILED DESCRIPTION OF THE INVENTION

Figure 1A:
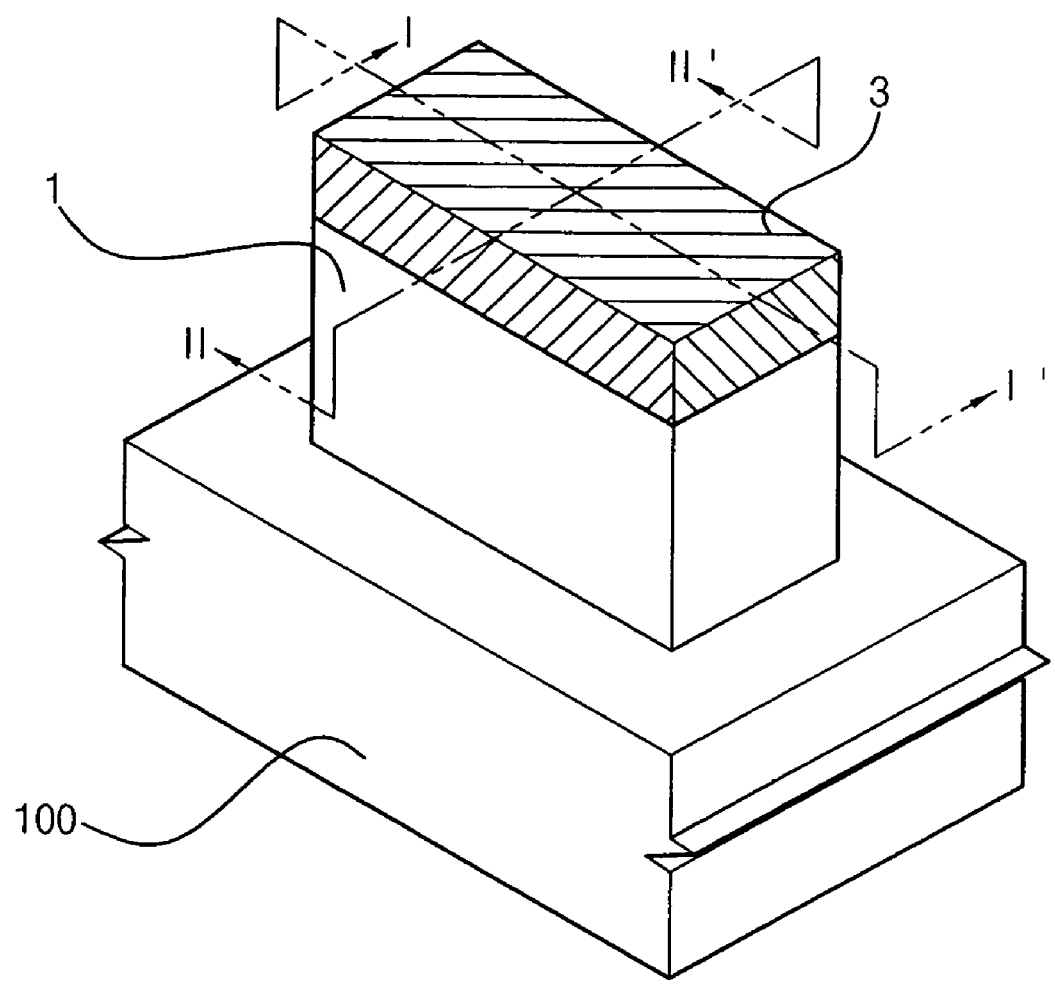
FIGS. 1a, 2a, 3a, 4a, 5a, 6a, 7a, 8a, 9a, and 10a are perspective views of stages in a method of fabricating a fin field effect transistor having a plurality of protruding channels, in accordance with the present invention.

Korean Patent Application No. 2004-104001, filed on Dec. 10, 2004, in the Korean Intellectual Property Office, and entitled: "Method of fabricating a Fin Field Effect Transistor having a plurality of protruding channels," is incorporated by reference herein in its entirety.

The present invention will now be described more fully hereinafter with reference to the accompanying drawings, in which exemplary embodiments of the invention are shown. The invention may, however, be embodied in different forms and should not be construed as limited to the embodiments set forth herein. In the drawings, the thickness of layers and regions are exaggerated for clarity. It will also be understood that when a layer is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals and characters in different drawings represent like elements throughout. Further, throughout the drawings, a left portion of the figure illustrates a cell region of a semiconductor device and a right portion of the figure illustrates a peripheral circuit region of the semiconductor device.

Figure 1B:
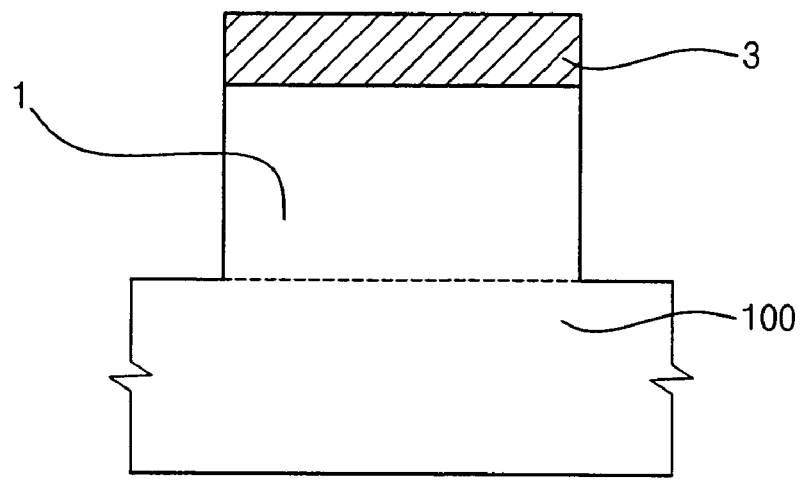
Figure 1C:
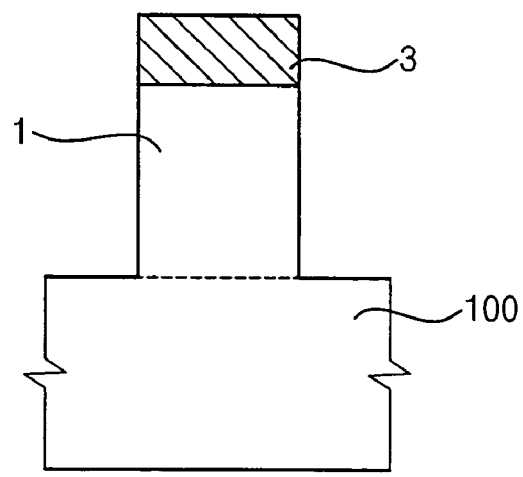

Referring to FIGS. 1a through 1c, A first hard mask layer is formed on a semiconductor substrate 100. A buffer oxide layer (not shown) can optionally be formed on the semiconductor substrate before forming the first hard mask layer. The buffer oxide protects the semiconductor substrate from damage due to wet etching while the first hard mask layer is later removed using a phosphoric acid chemical. The buffer oxide is, for example, formed by a thermal oxidation process or a HTO (Hot Temperature Oxide) process. The first hard mask layer comprises, for example, Silicon Nitride (SiN) or Silicon Oxynitride (SiON). The semiconductor substrate 100 comprises, for example, a bulk silicon wafer, a silicon-on-insulator (SOI) substrate, a silicon germanium-on-insulator (SGOI) substrate, or a SiGe wafer.

A photolithography process and an etching process are performed on the first hard mask layer to form a first hard mask pattern 3. The semiconductor substrate 100 is then partially etched to form an active region pattern 1 using the first hard mask pattern 3 as an etching mask. Transistors will be formed by performing subsequent fabrication processes on the active region pattern 1. At this point, isolation regions can optionally be formed between neighboring active region patterns 1.

Figure 2A:
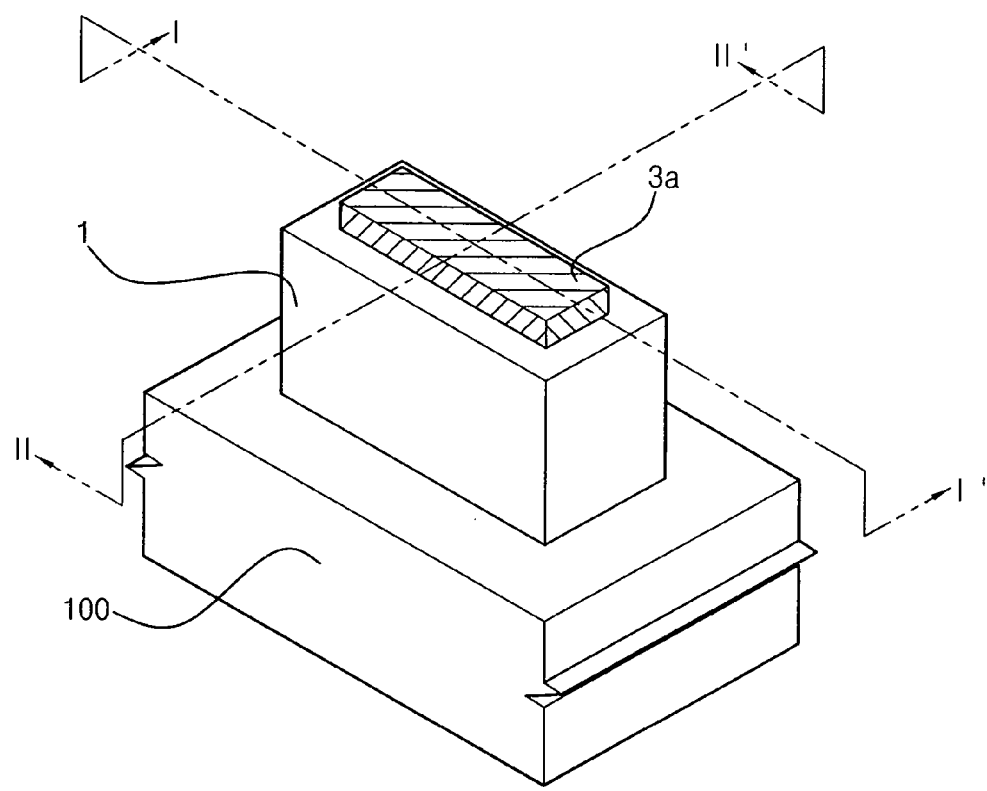
Figure 2B:
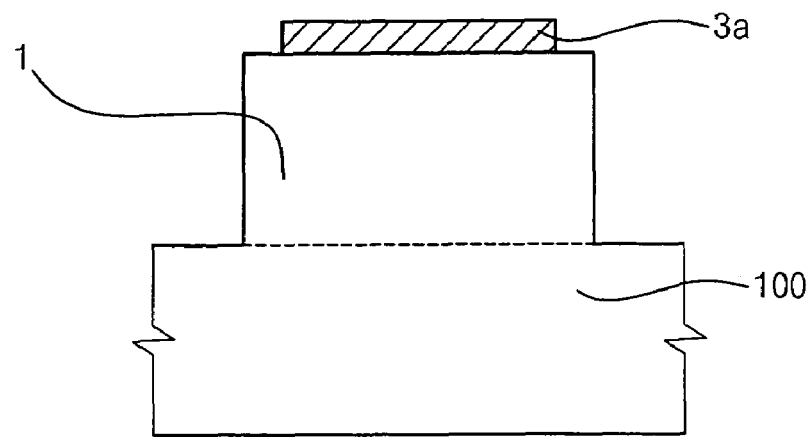
Figure 2C:
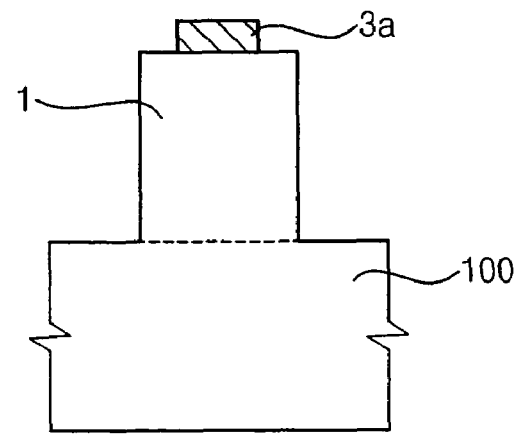

Referring to FIGS. 2a through 2c, a second hard mask pattern 3a is formed to expose a perimeter of the top edge surface of the active region pattern 1 after etching an edge portion of the first hard mask pattern 3 in a wet etching process.

The second hard mask pattern 3a comprises, for example, silicon nitride or silicon oxynitride. In this case, the wet etching process is performed using a phosphoric acid chemical.

Figure 3A:
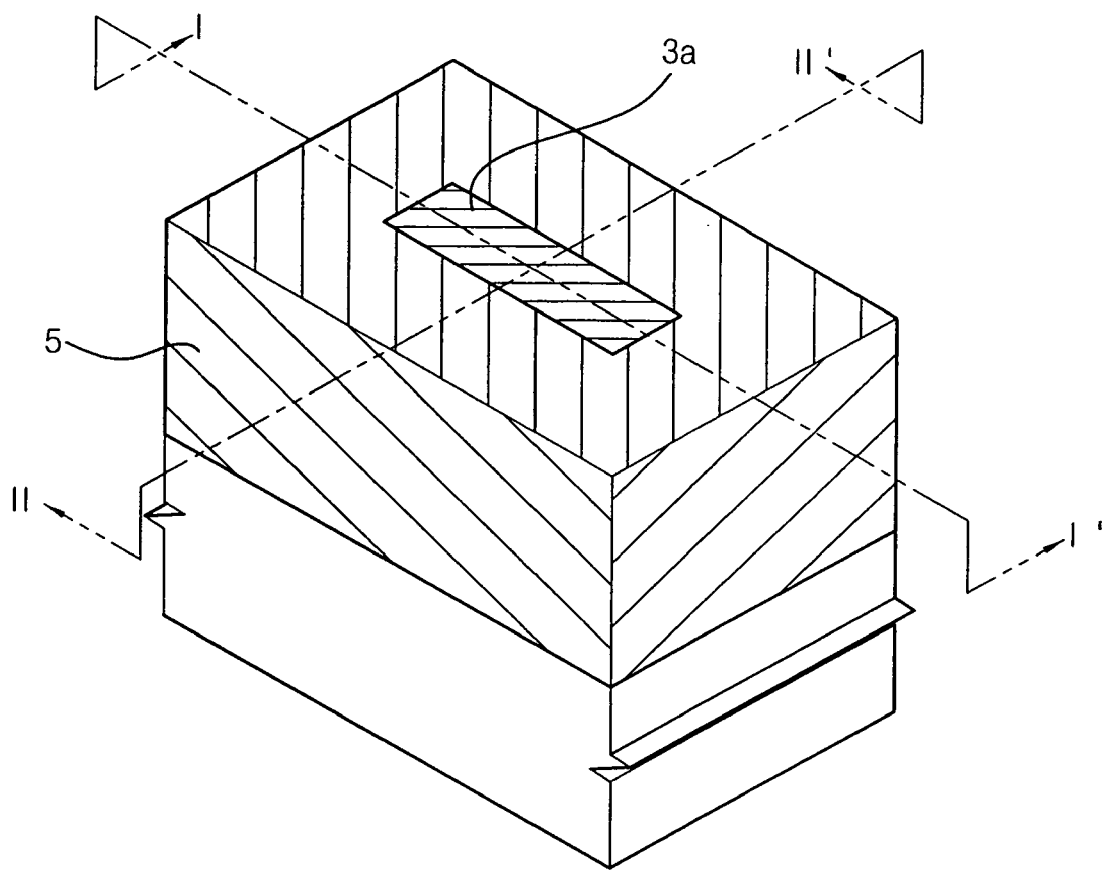
Figure 3B:
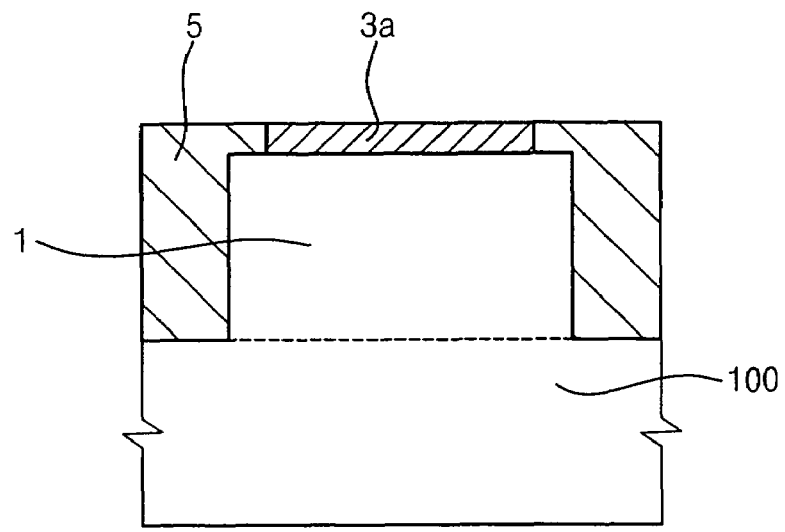
Figure 3C:
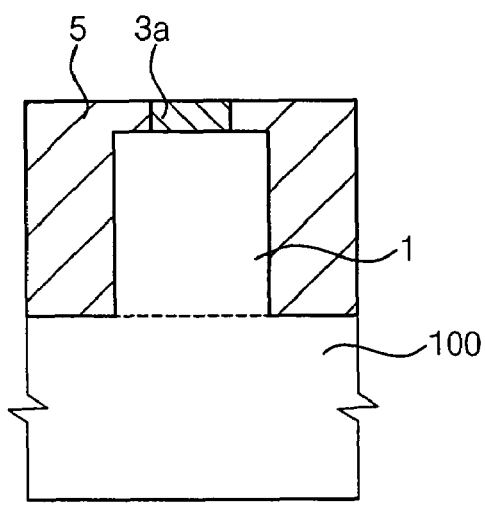

Referring to FIGS. 3a through 3c, a first insulating layer 5 is formed on the second hard mask pattern 3a and the active region pattern 1, so as to fully fill the isolation regions on lateral sides of the active region pattern 1. The first insulating layer 5 is planarized using a planarizing process to expose a top surface portion of the second hard mask pattern 3a. The first insulating layer 5 is then filled in the isolation region and neighboring active region patterns 1 are thus isolated electrically by the first insulating layer 5.

In one embodiment, the first insulating layer 5 comprises silicon dioxide and is formed using a High Density Plasma (HDP) chemical vapor deposition process. The planarizing process for the first insulating layer 5 can be performed, for example, by Chemical Mechanical Polishing (CMP) or etch back processes.

Figure 4A:
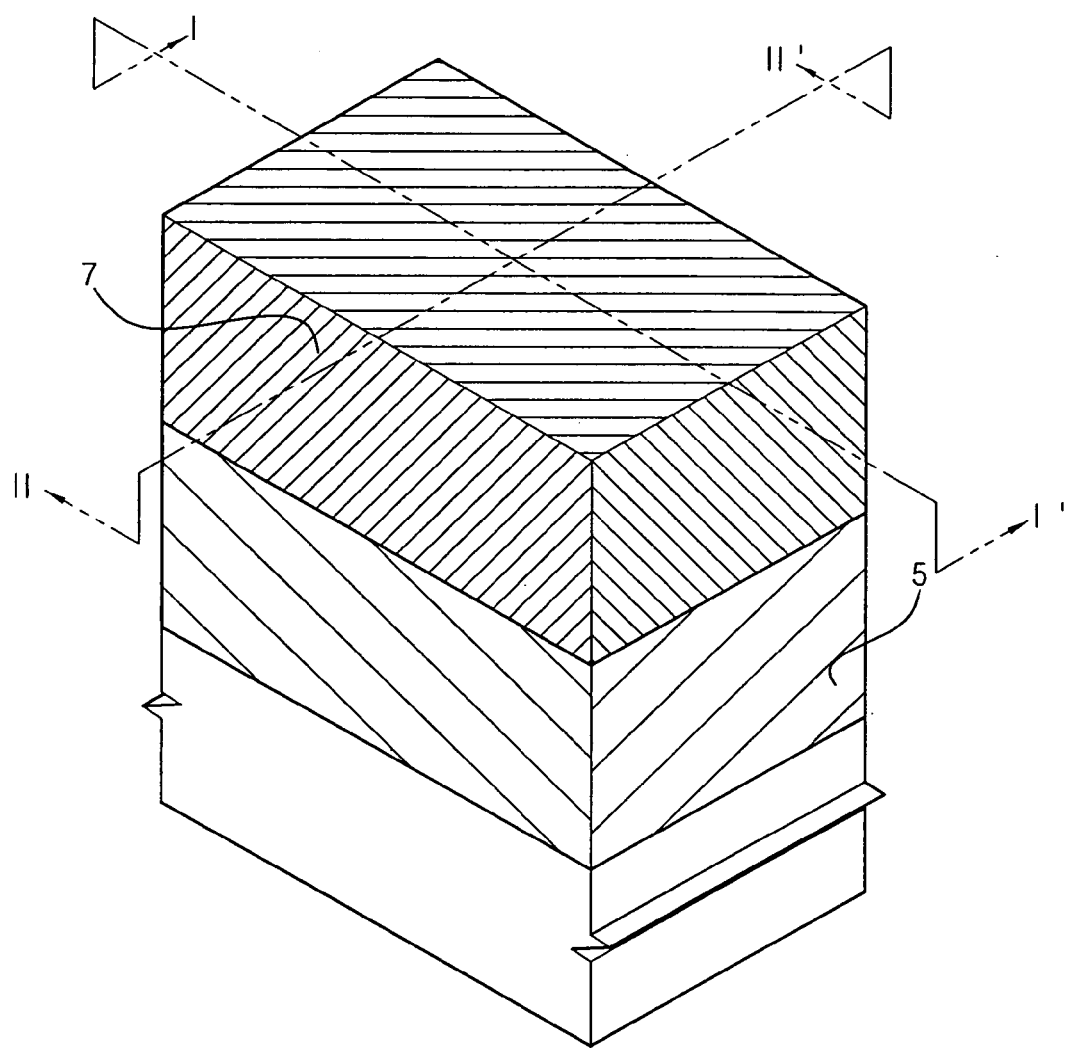
Figure 4B:
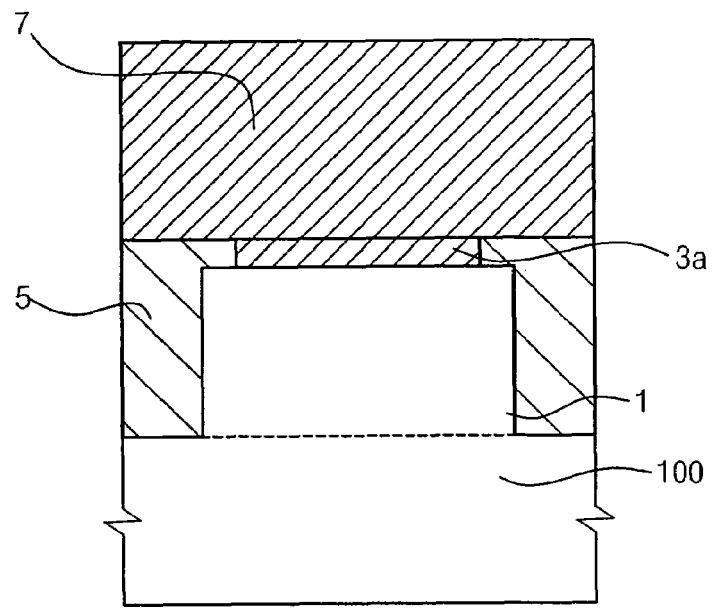
Figure 4C:
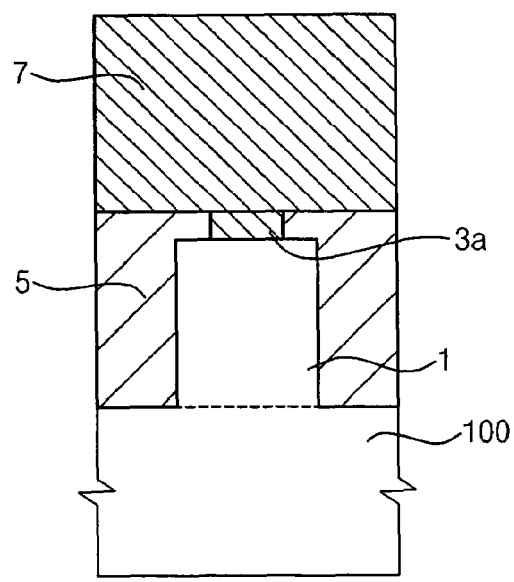

Referring to FIGS. 4a through 4c, a dummy gate layer 7 is formed on the first insulating layer 5 and the second hard mask pattern 3a. in one embodiment, the thickness of the dummy gate layer 7 is greater than the thickness of a gate that is eventually to be formed. In one embodiment, the dummy gate layer 7 is formed using the same material as the material of the second hard mask pattern 3a. The second hard mask pattern 3a and dummy gate layer 7 can be patterned and etched simultaneously in a subsequent wet etching process.

Figure 5A:
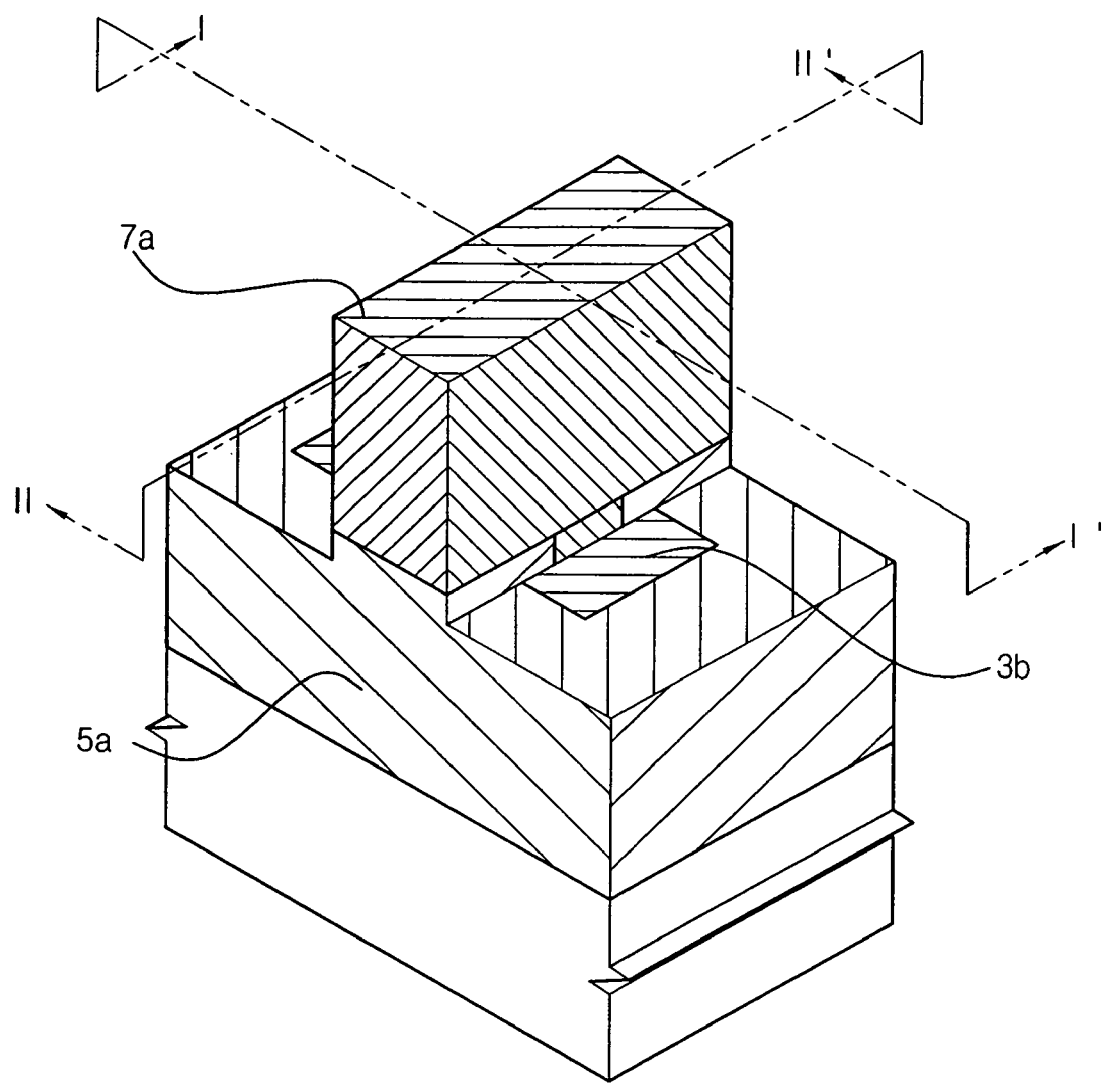
Figure 5B:
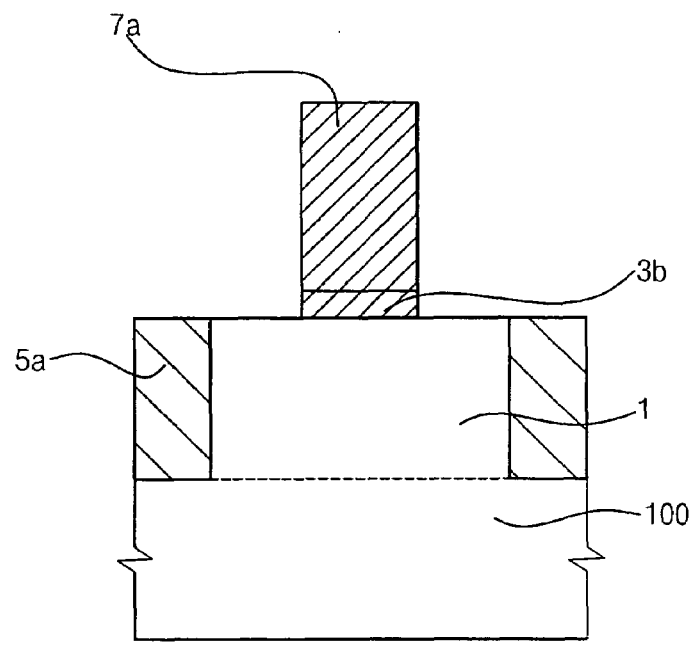
Figure 5C:
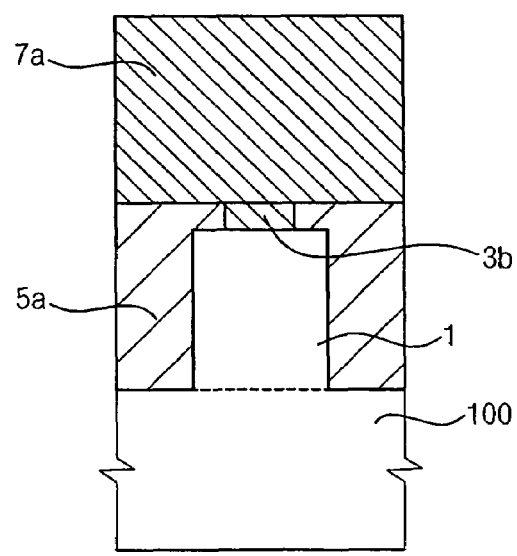

Referring to FIGS. 5a through 5c, a dummy gate pattern 7a is formed by patterning the dummy gate layer 7 using photolithography and etching processes. The first insulating layer 5 and the second hard mask pattern 3a are then etched to expose a top surface portion of the active region pattern 1 using the dummy gate pattern 7a as an etching mask.

The third hard mask pattern 3b is formed by etching the second hard mask pattern 3a. The third hard mask pattern 3b is used to define a trench region in which the gate electrode of the device will later be formed. Source and drain regions of the fin field effect transistor can optionally be formed at this time in the exposed portions of the active region pattern 1b, using the dummy gate pattern as an ion implantation mask.

Figure 6A:
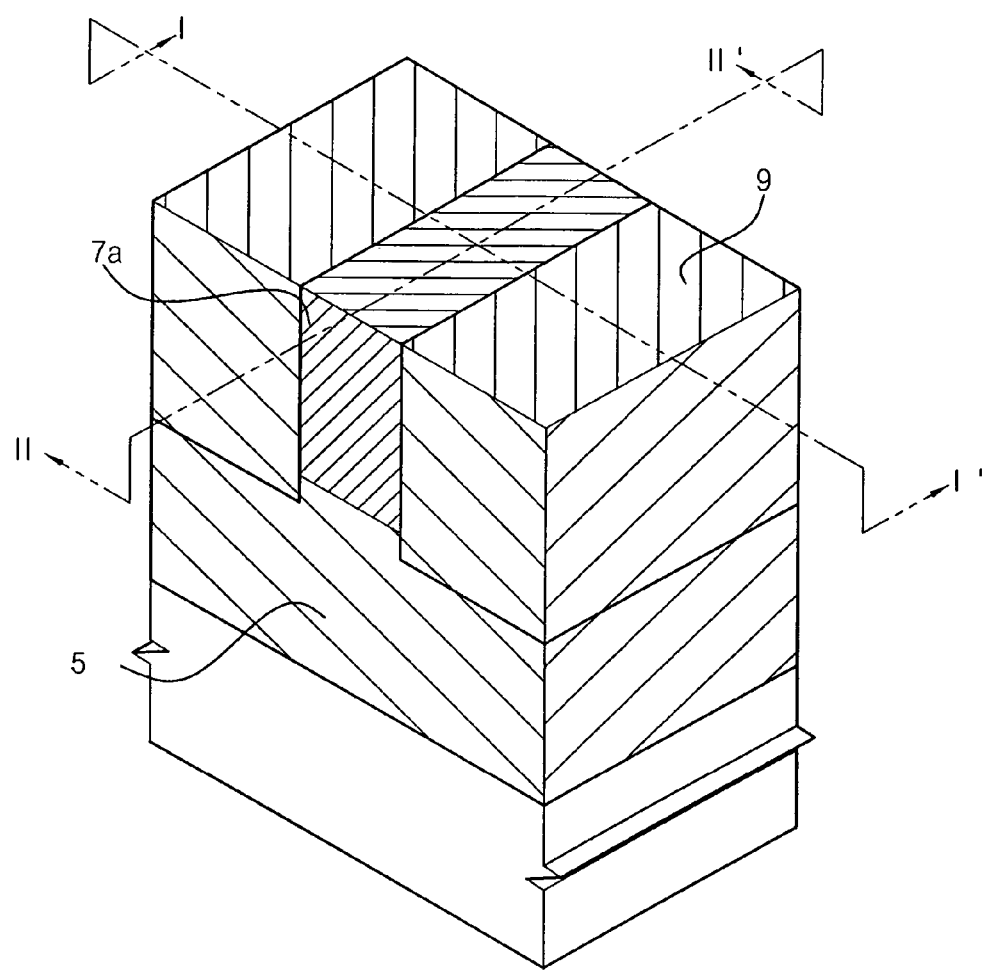
Figure 6B:
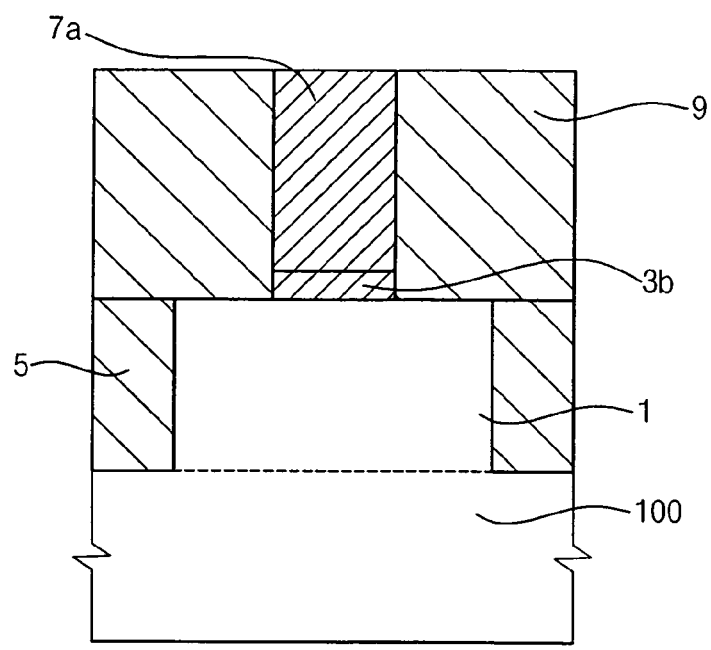
Figure 6C:
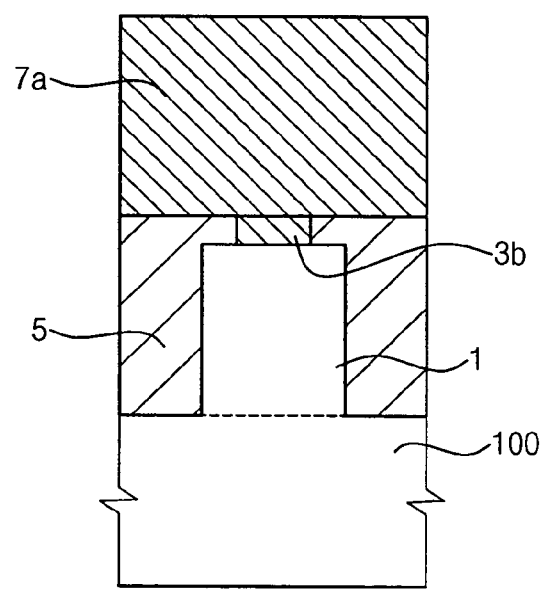

Referring to FIGS. 6a through 6c, a second insulating layer 9 is formed on the dummy gate pattern 7a and the exposed active region pattern 1. In one embodiment, the second insulating layer 9 is formed until the gaps between adjacent dummy gate patterns are fully filled, for example, until the second insulating layer lies above the dummy gate pattern 7a. The second insulating layer 9 is then planarized by a planarizing process to expose a top surface portion of the dummy gate pattern 7a.

The second insulating layer 9 comprises, for example, silicon dioxide and is formed, for example, in a High Density Plasma (HDP) chemical vapor deposition process. The planarizing process for the second insulating layer 9 is performed, for example, by Chemical Mechanical Polishing (CMP) or etching back processes.

Figure 7A:
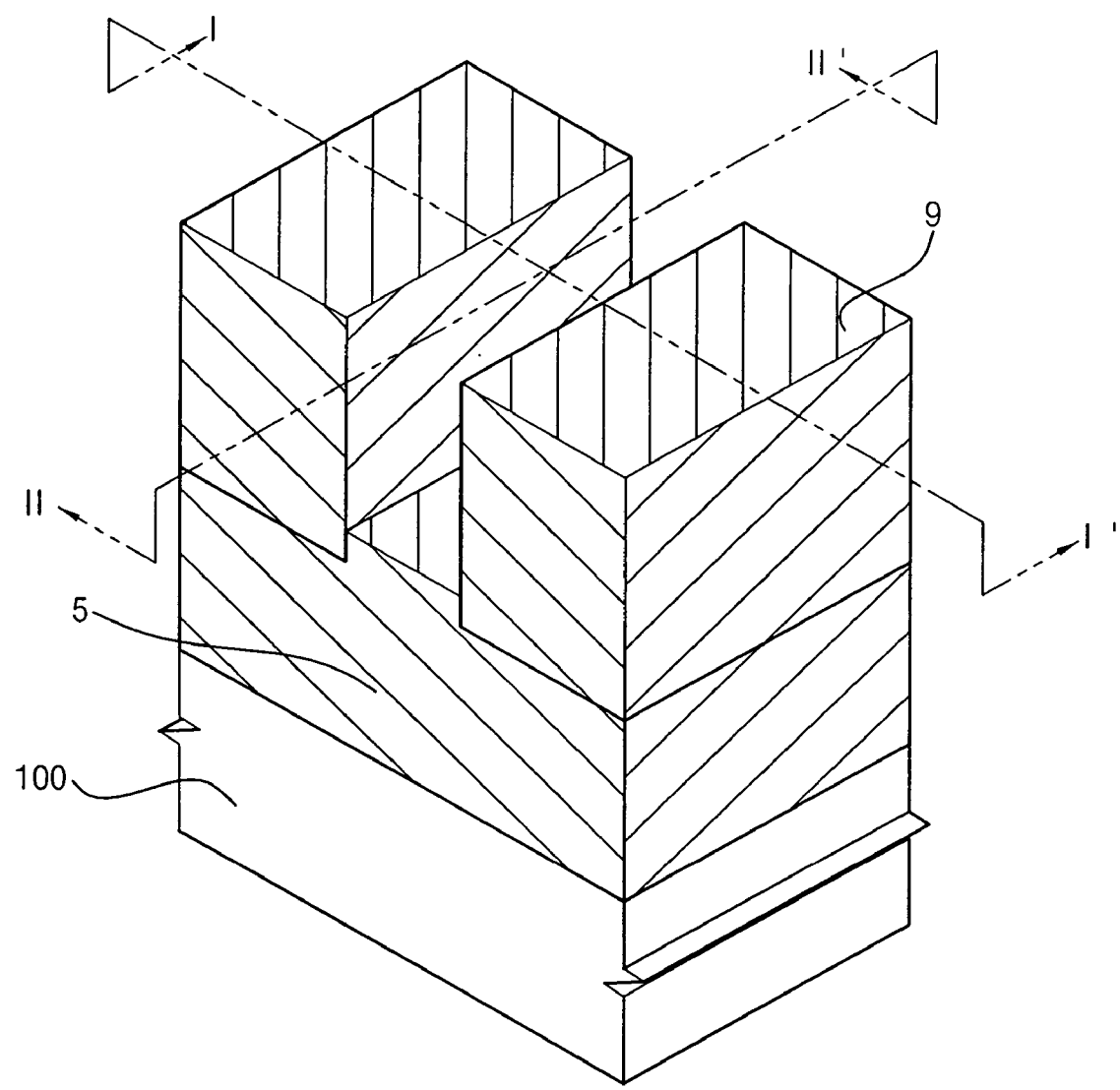
Figure 7B:
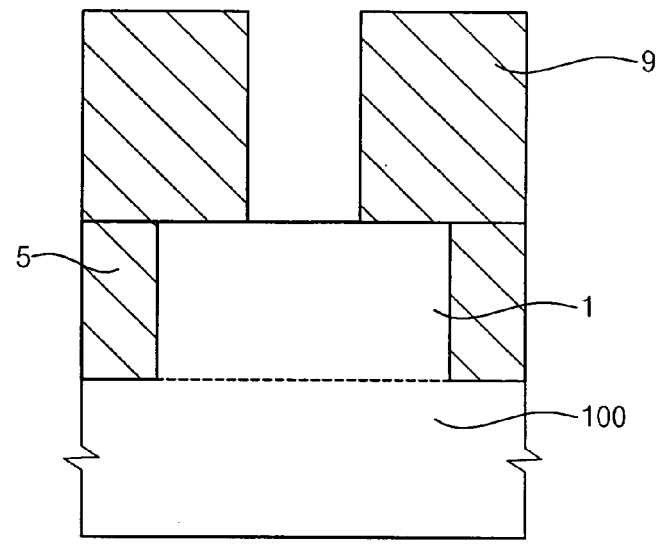
Figure 7C:
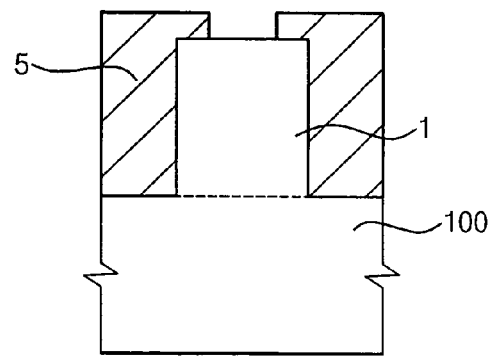

Referring to FIGS. 7a through 7c, the exposed dummy gate pattern 7a and the third hard mask pattern 3b are removed by a wet etching process to expose a top surface portion of the active region pattern 1. The dummy gate pattern 7a and the third hard mask pattern 3b comprise, for example, silicon nitride or silicon oxynitride. In this case, the wet etching process is performed, for example, using a phosphoric acid chemical. The exposed top surface portion of the active region pattern 1 defines a trench region in which a portion of the gate electrode will be formed.

Figure 8A:
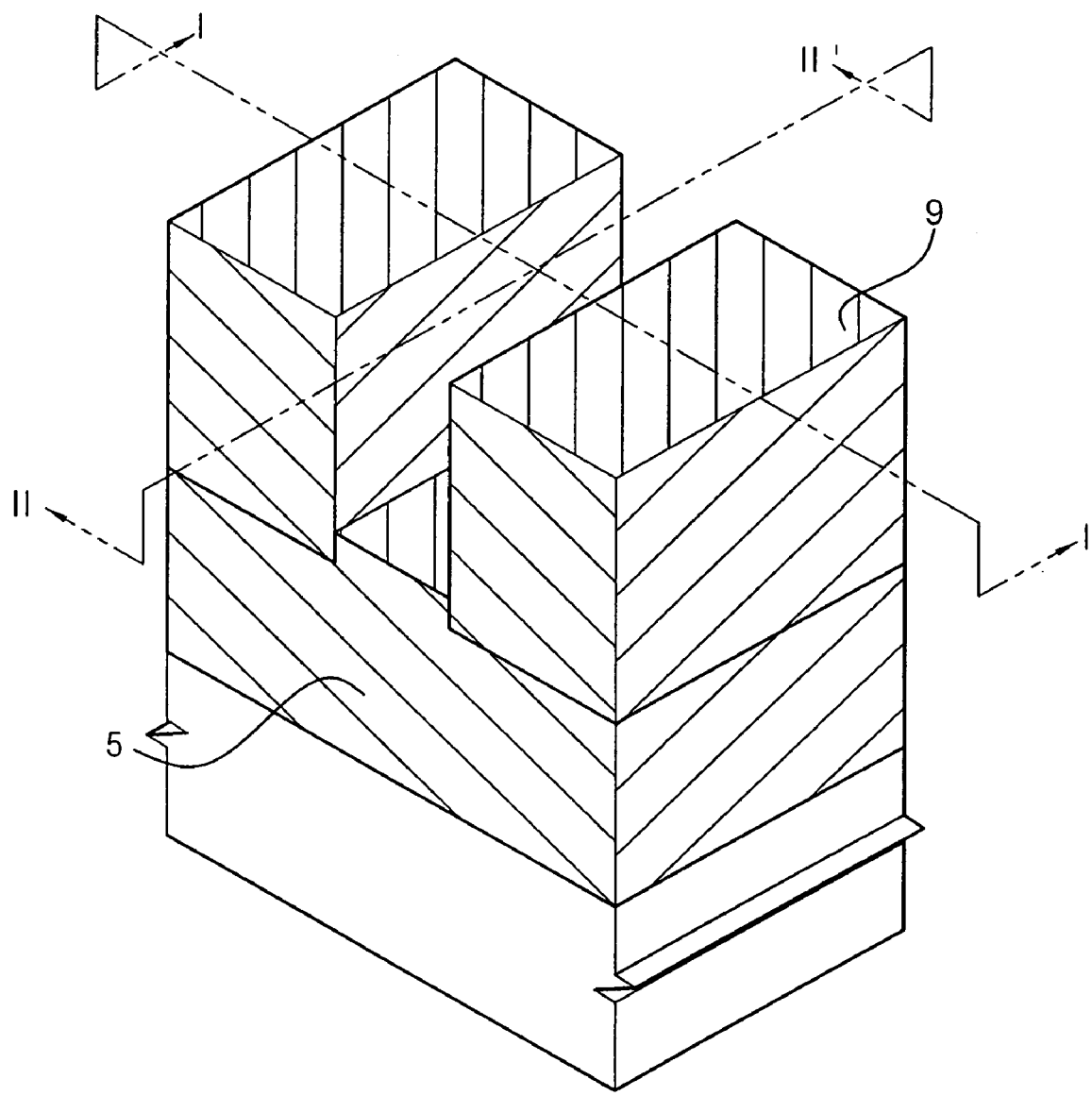
Figure 8B:
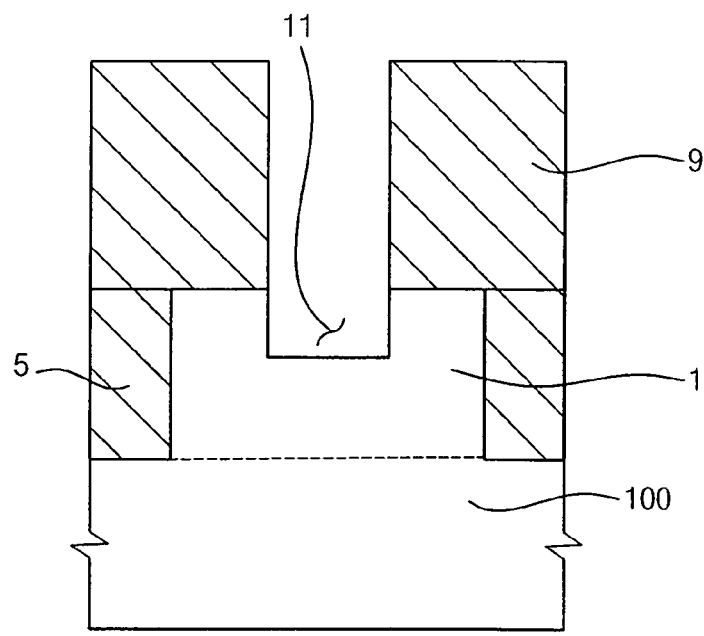
Figure 8C:
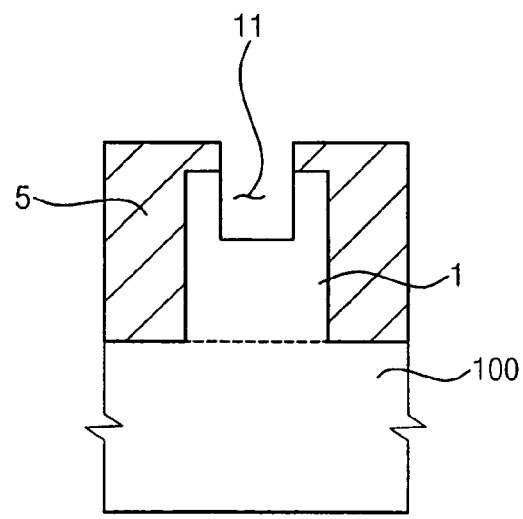

Referring to FIGS. 8a through 8c, the exposed active region pattern 1 is partially etched by an etching process to form a trench 11 in the active region pattern 1. The first and the second insulating layers function as an etch mask for this etch process. FIG. 8c illustrates that outer edge portions of the active region pattern 1 are not etched due to the presence of the first insulating layer 1 which functions as an etch mask during formation of the trench. In this manner, the active region pattern 1 has a plurality of vertically protruding channels. The protruding channels are three-dimensional in structure and operate to increase the current level of the resulting transistor.

Figure 9A:
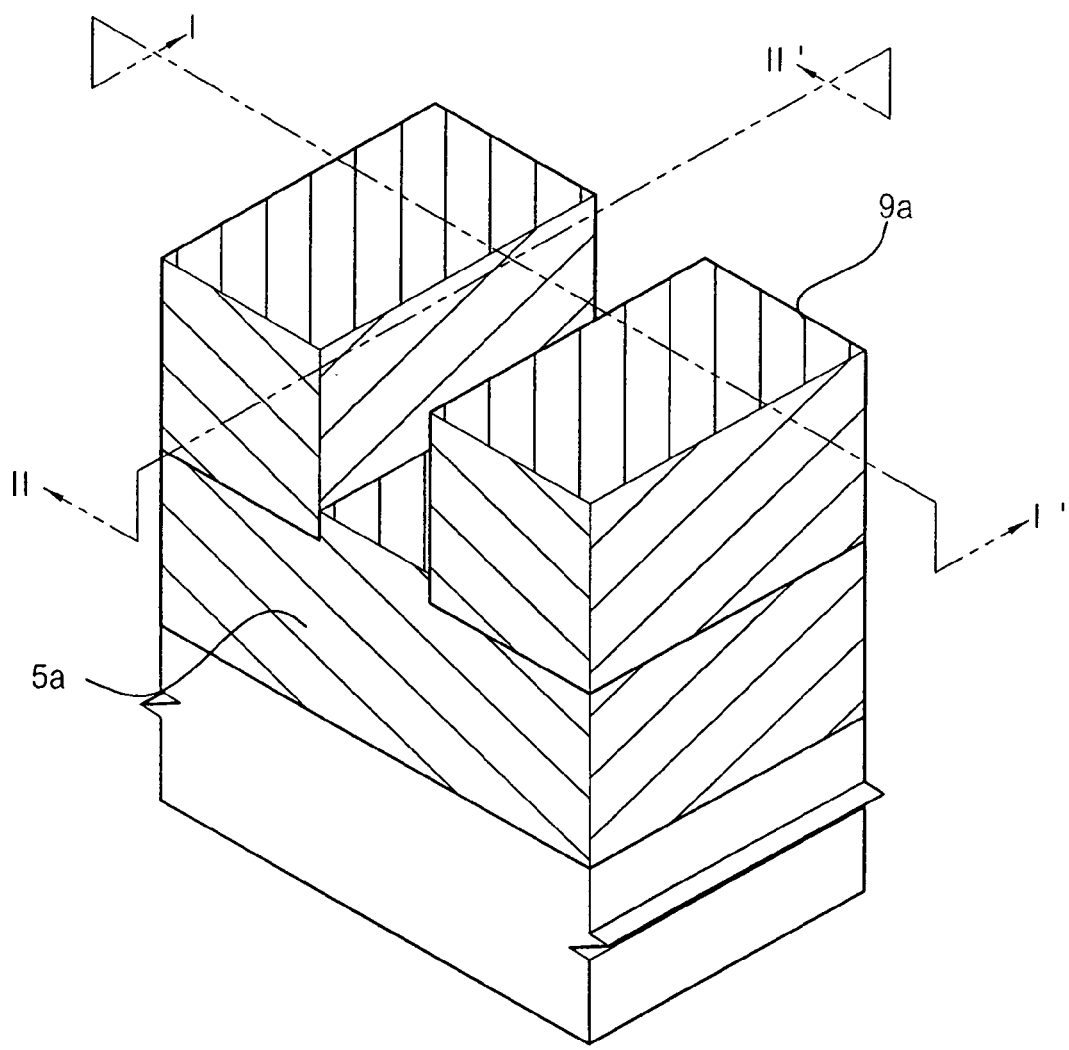
Figure 9B:
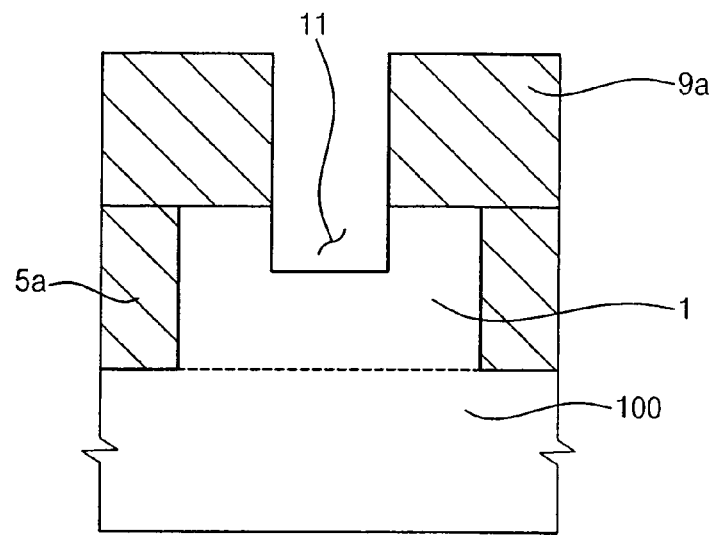
Figure 9C:
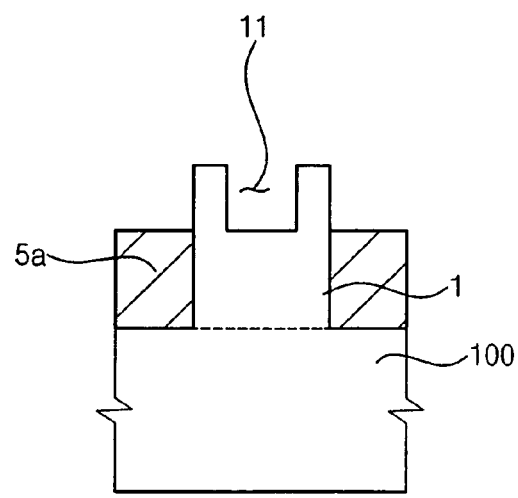

Referring to FIGS. 9a through 9c, the exposed portion of the first insulating layer 5 is recessed using an etch back process to expose a top surface portion and an outer sidewall portion of the active region pattern 1. In one embodiment, the recess process is performed using an anisotropic etching process. Assuming that the second insulating layer 9a material and the first insulating layer 5a material are the same, the second insulating layer 9a is also recessed at the same time the first insulating layer is recessed.

in one embodiment, the height of the exposed outer sidewall of the active region pattern 1 is substantially equal to, or similar to, the depth of the trench 11. In addition, transistor operation can be better stabilized by forming the vertical extensions at the same height above the main body of the active region pattern 1, as the extensions will provide the channel region for the transistor. The two channel regions are in parallel, and, in one embodiment, have a width of about 30 nm or less. The channel regions of the resulting transistor can operate as channel regions for different types of transistors, for example, a transistor that lies in a cell region of a memory device, or for a transistor that lies in a peripheral region of a memory device.

Any remaining second insulating layer 9a can optionally function as a mold layer when the gate electrode is formed. It is therefore preferable that the height of the remaining second insulating layer 9a is sufficiently higher than the desired height of the gate electrode to be formed.

Figure 10A:
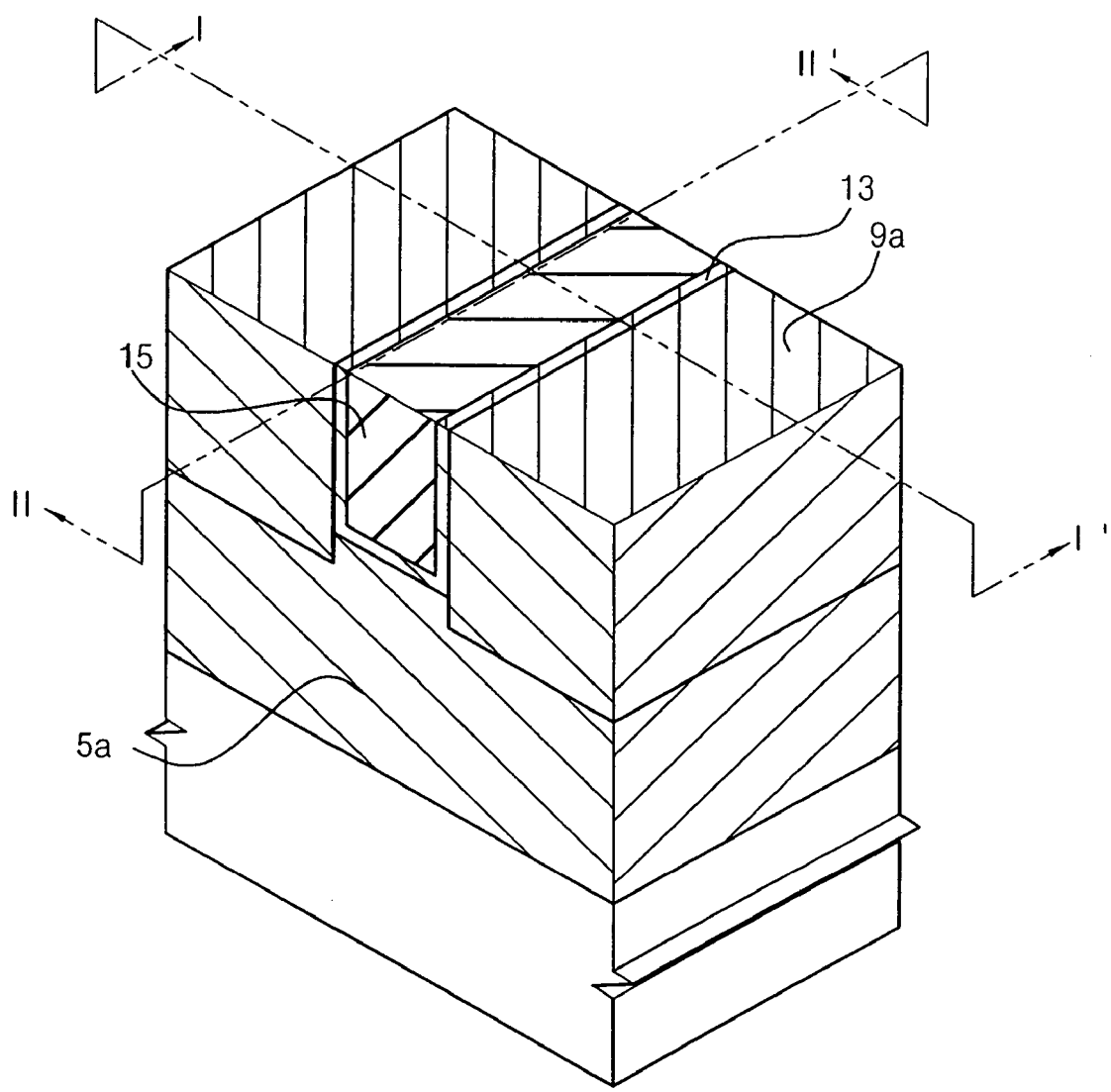
Figure 10B:
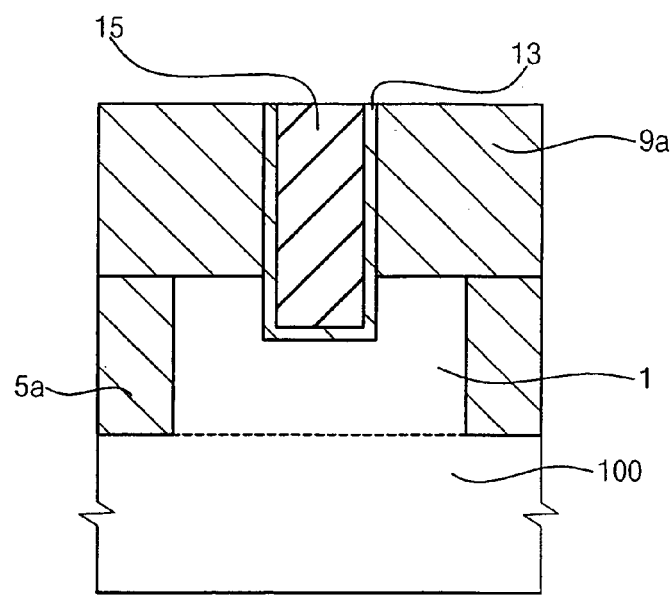
Figure 10C:
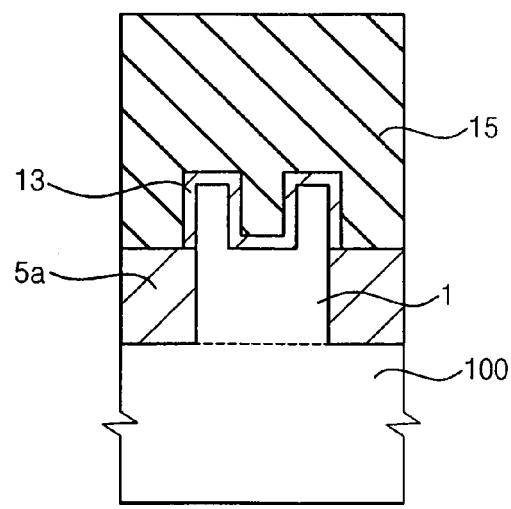

Referring to FIGS. 10a through 10c, a gate dielectric layer 13 is provided in the trench 11, on the upper surface 20 of vertically protruding channels of the active region pattern 1, and on the outer sidewalls 21 of the exposed portion of the active region pattern. The gate dielectric layer 13 can be formed, for example, by alternating processes of a thermal oxidation process and an atomic layer deposition process.

A gate electrode 15 is then formed on the gate dielectric layer 13. More specifically, a gate electrode layer is formed on the gate dielectric layer 13, the first insulating layer 5a, and the second insulating layer 9 to fill the trench region 11 and the gap between neighboring portions of the second insulating layer 9a. The gate electrode layer 15 is then planarized in a planarizing process to expose the top surface of the second insulating layer 9a.

The gate electrode 15 can optionally be formed in a damascene process rather than a conventional lithography process. As a result, the gate electrode is self-aligned with the trench region 11 and the plurality of vertically protruding channels. In this manner, misalignment between the gate electrode and the transistor channel region is minimized.

Contact holes can be formed in the second insulating layer to expose portions of the source/drain regions. The contact holes are then filled using a conductive layer to provide electrical contact with the source/drain regions of the device.

As disclosed above, the present invention provides at least the following advantages. In a first advantage, a plurality of vertically oriented three-dimensional channel structures having a fine line width are provided in an active region pattern. The effective channel width of the device is thereby increased without increasing the transistor unit area. Therefore, integration density of the semiconductor device is improved without increasing the semiconductor chip size.

A second advantage lies in that, the gate electrode is self-aligned with the active region pattern having the plurality of vertically, since the second insulating layer is used to both as an etch mask for forming the vertical channels in the active pattern region and as a mold within which the gate electrode layer is formed.

A third advantage lies in that the top surface of the gate electrode can be planarized in a damascene process. This approach is useful for forming word line contacts on the gate electrodes and for maintaining the topology of the semiconductor device.

The present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

What is claimed is:

1. A method of fabricating a fin field effect transistor, comprising:
    forming a first hard mask pattern on a semiconductor substrate;
    forming an active region pattern by partially etching the semiconductor substrate using the first hard mask pattern as an etching mask layer;
    forming a second hard mask pattern by removing an outer edge portion of the first hard mask pattern to expose a top surface portion of the active region pattern;
    forming a first insulating layer on the second hard mask pattern and the active region pattern;
    planarizing the first insulating layer to expose a top surface portion of the second hard mask pattern;
    forming a dummy gate layer on the second hard mask pattern and the first insulating layer;
    forming a dummy gate pattern by partially removing the dummy gate layer, the first insulating layer, and the second hard mask pattern to partially expose a top surface portion of the active region pattern;
    forming a second insulating layer on the dummy gate pattern and the active region pattern;
    planarizing the second insulating layer to expose a top surface portion of the dummy gate pattern;
    removing the dummy gate pattern and the second hard mask pattern to partially expose a top surface portion of the active region pattern;
    forming a trench region in the active region pattern by partially etching the exposed portion of the active region pattern;
    partially etching the first insulating layer to form a plurality of vertically protruding channel structures in the active region pattern, at least one vertically protruding channel structure being on a front and a rear side of the trench region;
    forming a gate dielectric layer on the active region pattern having the plurality of protruding channels; and
    forming a gate electrode on the gate dielectric layer.

2. The method of fabricating a fin field effect transistor as claimed in claim 1, further comprising forming a buffer oxide layer on the semiconductor substrate before forming the first hard mask pattern.

3. The method of fabricating a fin field effect transistor as claimed in claim 1, wherein planarizing the first insulating layer and the second insulating layer are performed by alternating processes of a CMP (Chemical Mechanical Polishing) process and an etching back process.

4. The method of fabricating a fin field effect transistor as claimed in claim 1, wherein the first and the second insulating layers comprise silicon dioxide.

5. The method of fabricating a fin field effect transistor as claimed in claim 4, wherein the silicon dioxide layer is formed in an HDP (High Density Plasma) process.

6. The method of fabricating a fin field effect transistor as claimed in claim 1, wherein the first hard mask pattern comprises silicon nitride.

7. The method of fabricating a fin field effect transistor as claimed in claim 1, wherein removing the dummy gate pattern and the second hard mask pattern is performed in a wet etching process.

8. The method of fabricating a fin field effect transistor as claimed in claim 7, wherein the wet etching process comprises a phosphoric acid process.

9. The method of fabricating a fin field effect transistor as claimed in claim 1, wherein the gate dielectric layer is formed in an atomic layer deposition process.

10. The method of fabricating a fin field effect transistor as claimed in claim 1, wherein forming the gate electrode comprises:
depositing a gate electrode layer on the gate dielectric layer and the second insulating layer; and
planarizing the gate electrode layer to expose a top surface portion of the second dielectric layer.

11. The method of fabricating a fin field effect transistor as claimed in claim 1, wherein removing the outer edge portion of the second hard mask pattern is performed in a wet etching process.

12. The method of fabricating a fin field effect transistor as claimed in claim 1, further comprising forming a source and a drain region in exposed portions of the active region pattern before forming the second insulating layer.

13. The method of fabricating a fin field effect transistor as claimed in claim 1, wherein the semiconductor substrate is selected from the group consisting of a bulk silicon wafer, a silicon-on-insulator (SOI) substrate, a silicon germanium-on-insulator (SGOI) substrate, and a SiGe wafer.

14. The method of fabricating a fin field effect transistor as claimed in claim 1, wherein the plurality of vertically protruding channel structures are two in number and are parallel to each other.

15. The method of fabricating a fin field effect transistor as claimed in claim 1, wherein the plurality of vertically protruding channel structures have a thickness of about 30 nm or less.

16. The method of fabricating a fin field effect transistor as claimed in claim 1, wherein the plurality of vertically protruding channel structures comprise channel structures for transistors that are formed in at least one of a cell region and a peripheral region of a semiconductor device.

17. A method of fabricating a fin field effect transistor, comprising:
forming a dummy gate layer on a first hard mask pattern and a first insulating layer on a semiconductor substrate having an active region pattern such that the first hard mask pattern partially covers a top portion of the active region pattern and such that a remaining portion of the top portion of the active region pattern is exposed;
forming a dummy gate pattern by partially etching the dummy gate layer, the first insulating layer, and the first hard mask pattern to partially expose a top surface portion of the active region pattern;
forming a source and drain region in the exposed active region;
forming a second insulating layer on the dummy gate pattern and the active region pattern;
planarizing the second insulating layer to expose a top surface portion of the dummy gate pattern;
removing the dummy gate pattern and the first hard mask pattern to partially expose a top surface portion of the active region pattern;
forming a trench region in the active region pattern by partially etching the exposed portion of the active region pattern;
partially etching the first insulating layer to form a plurality of protruding channel structures in the active region pattern at opposed sides of the trench region;
forming a gate dielectric layer on the active region pattern having the plurality of protruding channels; and
forming a gate electrode on the gate dielectric layer.

18. The method of fabricating a fin field effect transistor as claimed in claim 17, wherein forming the gate electrode comprises:
depositing a gate electrode layer on the gate dielectric layer and the second insulating layer; and
planarizing the gate electrode layer to expose a top surface portion of the second dielectric layer.

19. The method of fabricating a fin field effect transistor as claimed in claim 17, wherein the first and second insulating layers comprise silicon dioxide.

20. The method of fabricating a fin field effect transistor as claimed in claim 19, wherein the silicon dioxide layer is formed in an HDP (High Density Plasma) process.

21. The method of fabricating a fin field effect transistor as claimed in claim 17, wherein the first hard mask pattern comprises silicon nitride.

22. The method of fabricating a fin field effect transistor as claimed in claim 17, wherein removing the dummy gate pattern and the first hard mask pattern is performed in a wet etching process.

23. The method of fabricating a fin field effect transistor as claimed in claim 22, wherein the wet etching process comprises a phosphoric acid strip process.

24. The method of fabricating a fin field effect transistor as claimed in claim 17, wherein the gate dielectric layer is formed in an atomic layer deposition process.

25. The method of fabricating a fin field effect transistor as claimed in claim 17, wherein the semiconductor substrate is selected from the group consisting of a bulk silicon wafer, a silicon-on-insulator (SOI) substrate, a silicon germanium-on-insulator (SGOI) substrate, and a SiGe wafer.

26. The method of fabricating a fin field effect transistor as claimed in claim 17, wherein the plurality of vertically protruding channel structures are two in number and are parallel to each other.

27. The method of fabricating a fin field effect transistor as claimed in claim 17, wherein the plurality of vertically protruding channel structures have a thickness of about 30 nm or less.

28. The method of fabricating a fin field effect transistor as claimed in claim 17, wherein the plurality of vertically protruding channel structures comprise channel structures for transistors that are formed in at least one of a cell region and a peripheral region of a semiconductor device.

* * * * *